(12) United States Patent
Jou et al.

(10) Patent No.: US 9,911,732 B2
(45) Date of Patent: Mar. 6, 2018

(54) VERTICAL METAL INSULATOR METAL CAPACITOR HAVING A HIGH-K DIELECTRIC MATERIAL

(71) Applicant: TAIWAN SEMICONDUCTOR MANUFACTURING CO., LTD., Hsinchu (TW)

(72) Inventors: Chewn-Pu Jou, Hsinchu (TW); Tien-I Bao, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/701,218

(22) Filed: Sep. 11, 2017

(65) Prior Publication Data

US 2017/0373056 A1 Dec. 28, 2017

Related U.S. Application Data

(62) Division of application No. 15/165,939, filed on May 26, 2016, now Pat. No. 9,793,264.

(51) Int. Cl.
| | |
|---|---|
| *H01L 21/00* | (2006.01) |
| *H01L 27/06* | (2006.01) |
| *H01L 23/528* | (2006.01) |
| *H01L 23/522* | (2006.01) |
| *H01L 21/311* | (2006.01) |
| *H01L 49/02* | (2006.01) |
| *H01L 21/02* | (2006.01) |

(52) U.S. Cl.
CPC .... *H01L 27/0629* (2013.01); *H01L 21/02271* (2013.01); *H01L 21/31111* (2013.01); *H01L 23/528* (2013.01); *H01L 23/5226* (2013.01); *H01L 28/60* (2013.01); *H01L 21/0217* (2013.01); *H01L 21/02148* (2013.01); *H01L 21/02159* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01)

(58) Field of Classification Search
CPC .......... H01L 27/0629; H01L 21/02271; H01L 23/5226; H01L 23/528; H01L 28/60; H01L 21/02148; H01L 21/02159; H01L 21/0217

See application file for complete search history.

(56) References Cited

U.S. PATENT DOCUMENTS

| | | |
|---|---|---|
| 8,810,002 B2 | 8/2014 | Jou et al. |
| 9,006,061 B2 | 4/2015 | Jou et al. |

*Primary Examiner* — Nicholas Tobergte
(74) *Attorney, Agent, or Firm* — Sterne, Kessler, Goldstein & Fox P.L.L.C.

(57) ABSTRACT

A vertical metal-insulator-metal (MIM) capacitor is formed within multiple layers of a multi-level metal interconnect system of a chip. The vertical MIM capacitor has a first electrode, a second electrode, and a high-k capacitor dielectric material disposed therebetween. The dielectric constant of the capacitor dielectric material is greater than the dielectric constant of interlayer dielectric (ILD) material. After ILD is removed from between the vertically-oriented, interdigitated portions of the first and second electrodes, a capacitor dielectric material having a dielectric constant greater than the MD dielectric material is disposed therebetween.

20 Claims, 18 Drawing Sheets

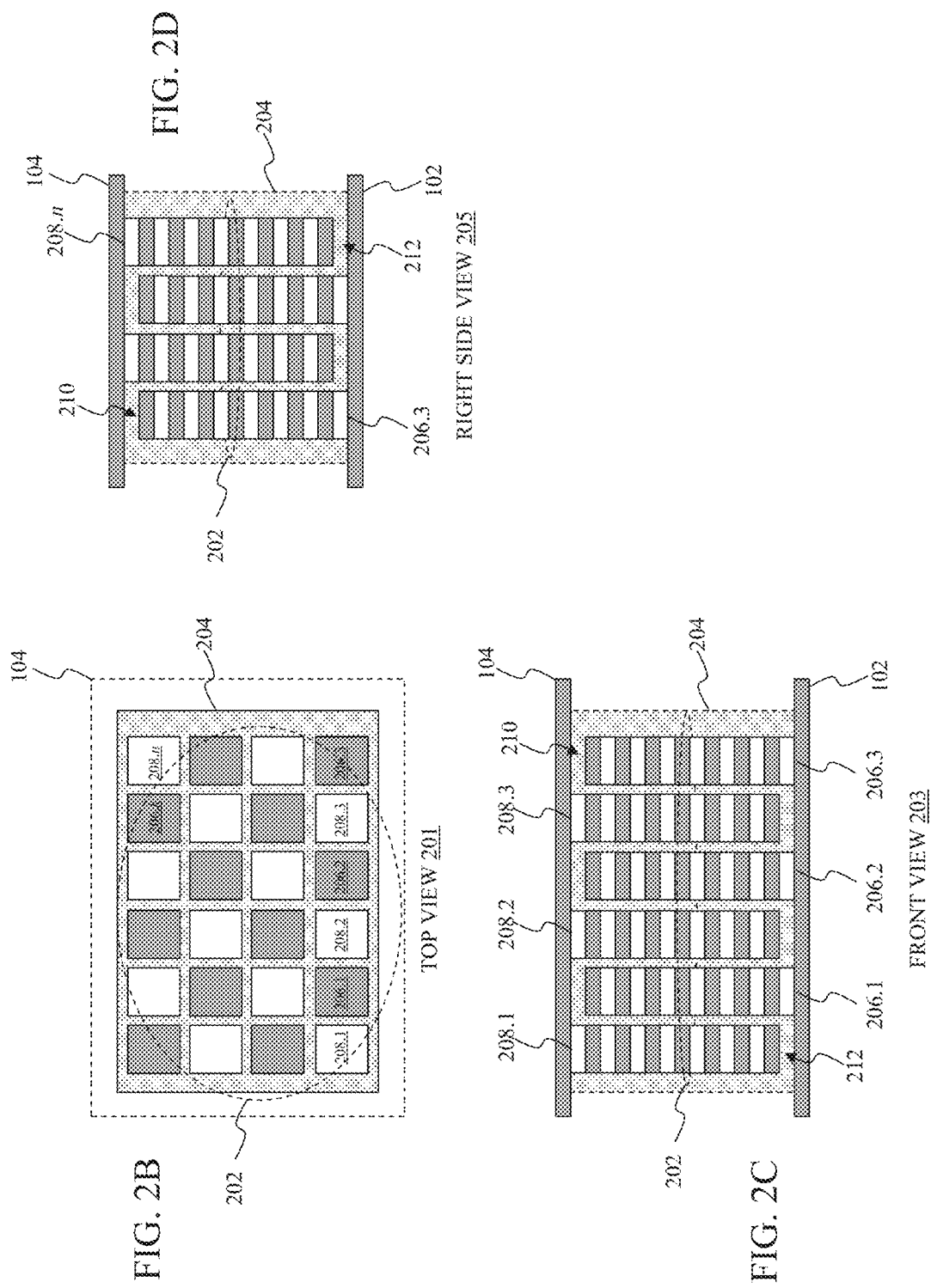

VERTICAL METAL INSULATOR METAL CAPACITOR HAVING A HIGH-K DIELECTRIC MATERIAL

CROSS REFERENCE TO RELATED APPLICATIONS

This application is a divisional of, and claims the benefit of, U.S. application Ser. No. 15/165,939, filed May 26, 2016, the disclosure of which is incorporated by reference herein in its entirety.

BACKGROUND

The continued improvement of semiconductor processes has allowed manufacturers and designers to create a smaller and a more powerful electronic devices. Semiconductor processes have advanced from a 10 µm process that was reached around 1971 to a 22 nm process technology that was reached around 2012. Semiconductor processes are expected to further progress to a 5 nm technology node around 2019. With each progression of the semiconductor fabrication process, devices and structures of integrated circuits have become smaller, which allows more components to be fabricated on a chip.

One challenge relates to the fabrication of capacitors in processes designed for ever smaller feature sizes. Manufacturers and designers of capacitors have less real estate available on the chip to fabricate the capacitors with each new generation of semiconductor processes. Manufacturers and designers have begun to explore other options that are available with advanced semiconductor technology nodes to construct capacitors that operate in a similar manner as capacitors constructed with older semiconductor process technologies without sacrificing performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B through 2D illustrate two dimensional representations of the exemplary vertical MIM capacitor of FIG. 2A, according to some embodiments.

DETAILED DESCRIPTION

Figure 1:
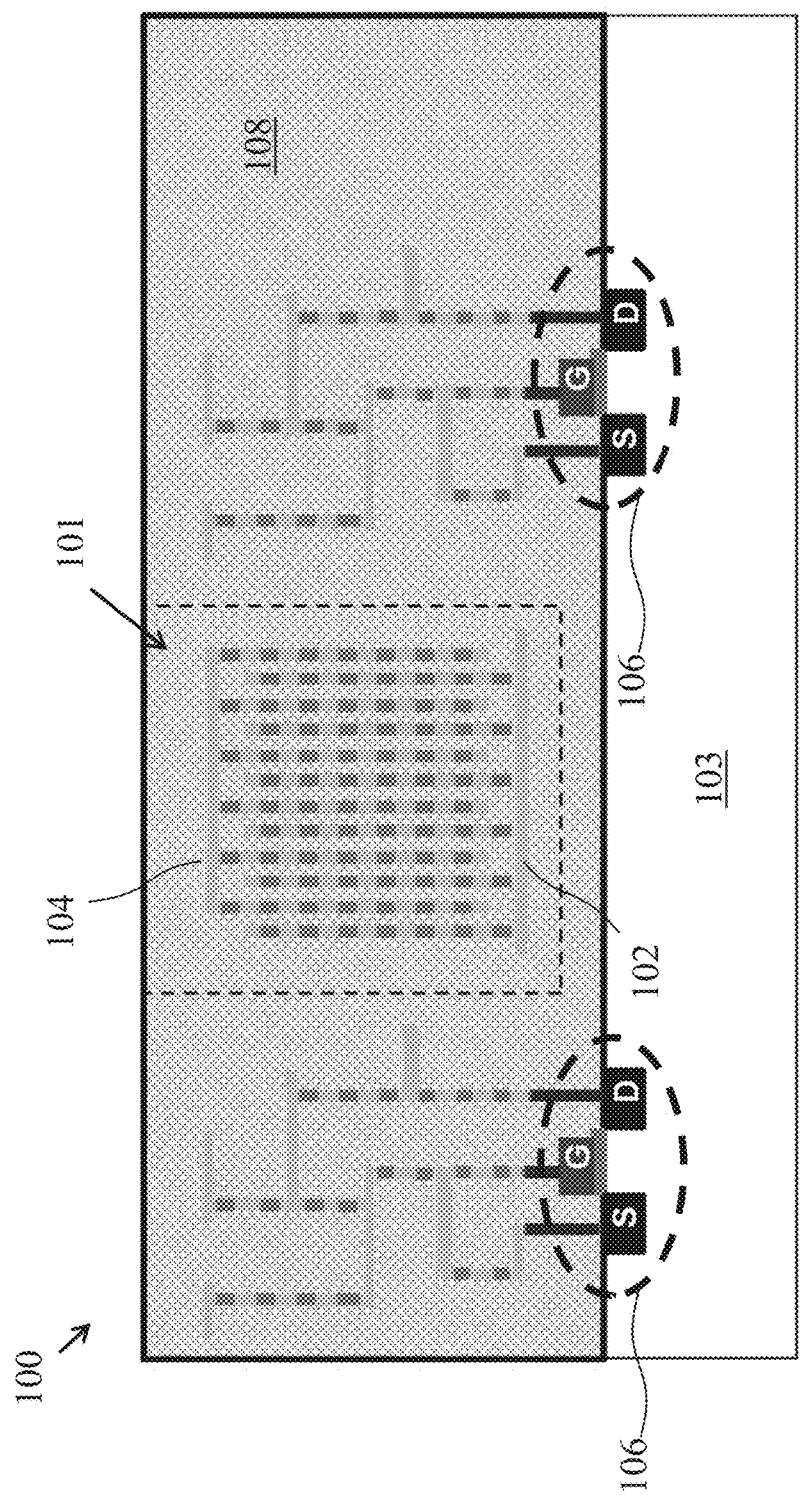
FIG. 1 illustrates the integration of a MIM capacitor within an integrated circuit, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The expression "high-k" refers to a high dielectric constant. High-k refers to a dielectric constant that is greater than the dielectric constant of $SiO_2$ (i.e., greater than about 3.9). Similarly "low-k" refers to a low dielectric constant and refers to a dielectric constant that is less than or equal to the dielectric constant of $SiO_2$ (i.e., less than or equal to about 3.9).

The term via refers to a structure for electrical connection of conductors from different interconnect levels. Via is sometimes used in the art to describe both an opening in an insulator in which the structure will be completed, and the completed structure itself. For purposes of this disclosure, via refers to the completed structure.

The terms, chip, integrated circuit, semiconductor device, and microelectronic device, are often used interchangeably in this field of art. Embodiments of the present disclosure are applicable to all the above as they are generally understood in the art.

Overview

A metal insulator metal (MIM) capacitor having a high-k dielectric is formed on a semiconductor layer stack having multiple conductive layers associated with a first electrode of the capacitor interdigitated with multiple conductive layers associated with a second electrode of the capacitor. The first and second electrodes of the capacitor each may include first and second conductive plates, respectively, spaced apart in a vertical direction, but parallel to one another. A first group of conductive structures traverse in a vertical direction between the conductive plates, and are physically and electrically connected to the first conductive plate, while a second group of conductive structures traverse in a vertical direction between the conductive plates, and are physically and electrically connected to the second conductive plate. The capacitor includes a dielectric material between the first and second conductive plates, and between the first and second groups of conductive structures.

FIG. 1 is a cross-sectional view of an example integrated circuit 100 that includes a MIM capacitor 101 integrated with transistors 106 over a substrate 103. Substrate 103 is typically, but not limited to, a silicon substrate. In other embodiments, substrate 103 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 103 is a semiconductor on insulator (SOI). Transistors 103 may be any type of field effect transistors, including but not limited to p-channel FETs, n-channels FETs, planar FETs, finFETs.

MIM capacitor 101 includes a first electrode having a first conductive plate 102 and a second electrode having a second conductive plate 104. Each electrode of MIM capacitor 101 includes vertical conductive structures, with vertical conductive structures physically and electrically connected with first conductive plate 102 being interdigitated with vertical conductive structures physically and electrically connected with second conductive plate 104. That is, the exemplary first electrode includes a first electrically conductive plate 102 that is horizontally-oriented with respect to substrate 103, and further includes a plurality of electrically conductive structures that are vertically-oriented with respect to substrate 103.

A dielectric material 108 is disposed between the electrodes of MIM capacitor 101. In integrated circuit 100, the same dielectric material 108 also forms the inter-level dielectric (ILD) layers for the various metal lines that route signals between the devices on integrated circuit 100.

Due to the integration of MIM capacitor 101 with other devices in integrated circuit 100, the choice of dielectric materials is often limited. For example, dielectric material 108 may be silicon dioxide, which has a dielectric constant of about 3.9. Those of ordinary skill in the art will understand that the capacitance of the MIM capacitor will be increased if the dielectric constant of the dielectric material between its electrodes is increased. However, simply using a higher k material for dielectric material 108 may not be possible as it will lead to undesired increases in parasitic capacitance in other areas of integrated circuit 100. Embodiments herein relate to MIM capacitors having a high-k dielectric, while still being integrated within an integrated circuit that uses a lower k dielectric material elsewhere.

Exemplary Vertical MIM Capacitor Having a High-K Dielectric

Figure 2A:
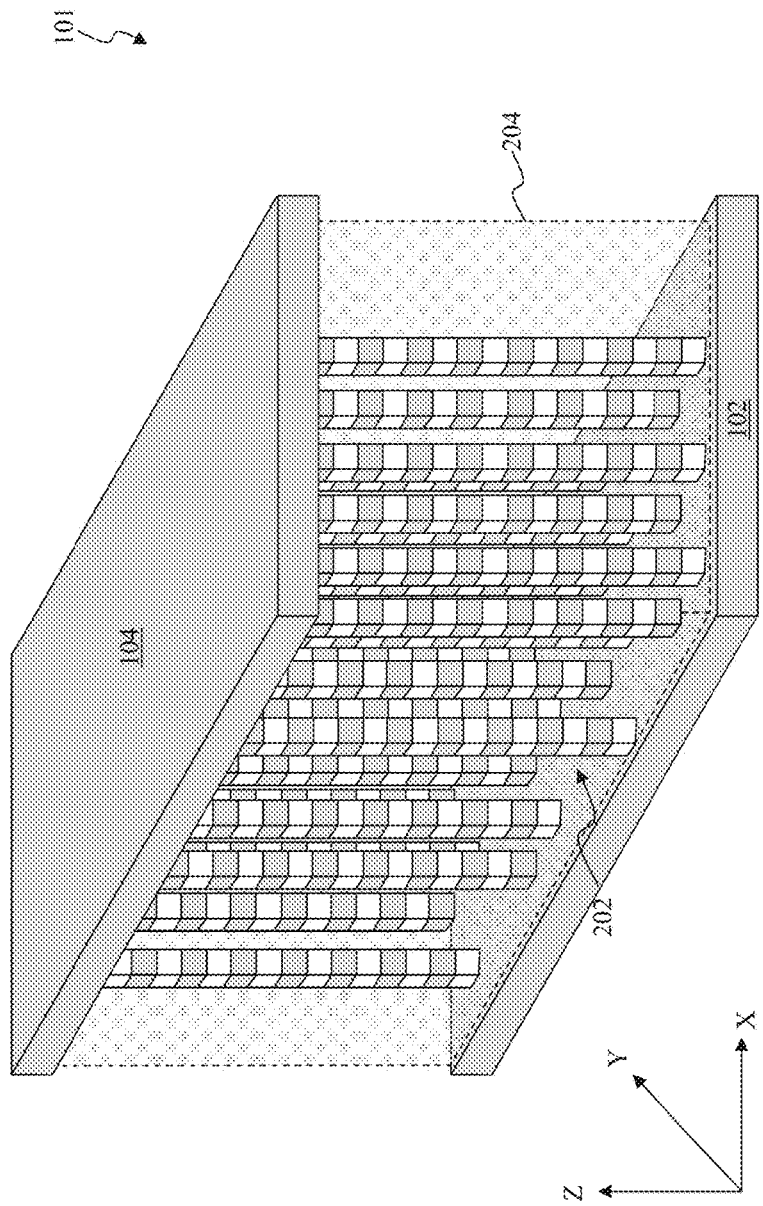
FIG. 2A illustrates a three-dimensional representation of an exemplary vertical metal insulator metal (MIM) capacitor having a high dielectric constant (high-k) material, according to an embodiment.

FIG. 2A shows a three dimensional representation of an exemplary vertical metal insulator metal (MIM) capacitor having a high-k material according to an exemplary embodiment of the present disclosure. A vertical MIM capacitor 101 includes a first conductive plate 102 and a second conductive plate 104 which form part of a first electrode and a second electrode, respectively, of MIM capacitor 100. First conductive plate 102 and second conductive plate 104 are arranged in a horizontal direction. First conductive plate 102 and second conductive plate 104 are patterned from respective ones of a plurality of conductive layers. The conductive layers include, but are not limited to one or more conductive materials such as tungsten (W), aluminum (Al), titanium (Ti), titanium nitride (TiN), tantalum (Ta), tantalum nitride (TaN), and copper (Cu). In this exemplary embodiment, the one or more conductive materials are patterned to form first conductive plate 102 and/or second conductive plate 104. First conductive plate 102 and second conductive plate 104 are isolated from other conductive elements by dielectric material. The dielectric material may include, but is not limited to silicon dioxide ($SiO_2$).

MIM capacitor 101 additionally includes multiple vertical conductive structures 202. The multiple vertical conductive structures 202 are vertically-oriented with respect to substrate 103. As illustrated in 2A, the multiple vertical conductive structures 202 are situated within multiple layers of a multi-level metal interconnect system of a chip. The multiple vertical conductive structures 202 in this exemplary embodiment include patterned metal interconnect structures from a plurality of interconnect levels, where the patterned metal interconnect structures of each vertical conductive structure 202 are vertically aligned with each other. The conductive material of each patterned metal interconnect structure may include, but is not limited to, one or more of W, Al, Ti, TiN, Ta, TaN, and Cu. The vertical conductive structures 202 further include vias that connect patterned metal interconnect structures on different levels. For example, in the illustration of MIM capacitor 101, the grey blocks represent patterned conductive blocks, while the white blocks represent vias. The vias may include, but are not limited to, any one or more of W, Al, Ti, TiN, Ta, TaN, and Cu), In one example, the vias have a smaller horizontal cross-sectional area than the conductive blocks. A first group of the conductive structures and a second group of the conductive structures are physically and electrically connected to first conductive plate 102 and second conductive plate 104, respectively, as shown in FIG. 2B.

MIM capacitor 101 further includes a dielectric region 204 between first conductive plate 102 and second conductive plate 104. As illustrated in FIG. 2A, dielectric region 204 exists between first conductive plate 102 and second conductive plate 104, and surrounds the multiple vertical conductive structures 202. Dielectric region 204 includes one or more layers of high-k materials such as aluminum oxide ($Al_2O_3$), hafnium dioxide ($HfO_2$), hafnium silicate ($HfSiO_4$), lanthanum oxide ($La_2O_3$), silicon nitride ($Si_3N_4$), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), or any other suitable material having a dielectric constant greater than a dielectric constant of silicon dioxide ($SiO_2$), according to some embodiments. The capacitance of MIM capacitor 101 is related to the dielectric constant of dielectric region 204.

In an exemplary embodiment, dielectric region 204 includes the one or more high-k materials having a dielectric constant that is greater than a dielectric constant of a conventional MIM capacitor, which may have, for example, silicon dioxide as its dielectric material. In one embodiment, MIM capacitor 101 having a high-k dielectric region 204 occupies less real estate, namely has a smaller footprint, in a semiconductor wafer than the conventional MIM capacitor while maintaining the same capacitance. In another embodiment, MIM capacitor 101 with high-k dielectric region 204 has a greater capacitance than the conventional MIM capacitor while maintaining the same footprint. In an embodiment, dielectric region 204 may include a combination of dielectric materials with different dielectric constants.

Further Illustration of the Exemplary Vertical MIM Capacitor

FIGS. 2B-2D are two dimensional representations of the exemplary vertical MIM capacitor of FIG. 2A, according to some embodiments. FIG. 2B illustrates a top view 201 of MIM capacitor 101. FIG. 2C illustrates a front view 203 of MIM capacitor 101. FIG. 2D illustrates a tight side view 205 of MIM capacitor 101. As illustrated in the top view 201, the multiple vertical conductive structures 202 include a first group of conductive structures 206.1 through 206.$k$, herein referred as the first group of conductive structures 206, and a second group of conductive structures 208.1 through 208.$n$, herein referred as the second group of conductive structures 208. The first group of conductive structures 206 and the second group of conductive structures 208 can include the same or different number of conductive structures from among the multiple vertical conductive structures 202. The first group of conductive structures 206 and the second group of conductive structures 208 are arranged in a matrix of rows and columns. However, those of ordinary skill in the relevant art(s) will recognize that other arrangements of the first group of conductive structures 206 and the second group of conductive structures 208 are possible without departing from the spirit and scope of the present disclosure. These other arrangements can include regular or irregular polygons that are constructed of linear segments, closed curves that are constructed of non-linear segments, or any other geometric shape that can be constructed using any suitable combination of linear and non-linear segments that will be apparent to those skilled in the relevant art(s). As illustrated in FIG. 2B, the first group of conductive structures 206 and the second group of conductive structures 208 are interdigitated within the rows and columns. For example, the first group of conductive structures 206 and the second group of conductive structures 208 alternate between each other in the rows and the columns.

As illustrated in FIG. 2B, the first group of conductive structures 206 are physically and electrically connected to first conductive plate 102, and the second group of conductive structures 208 are physically and electrically connected to second conductive plate 104. First group of conductive structures 206 are not physically or electrically connected to second conductive plate 104 and second group of conductive structures 208 are not physically or electrically connected to first conductive plate 102. For convenience, second conductive plate 104 is illustrated without shading in the top view 200. As illustrated in the front view 203 and the right side view 205, the first group of conductive structures 206 and the second group of conductive structures 208 traverse in the vertical direction between first conductive plate 102 and second conductive plate 104.

A first spacing 210 in the vertical direction isolates the first group of conductive structures 206 from the second conductive plate 104, and a second spacing 212 in the vertical direction isolates the second group of conductive structures 208 from the first conductive plate 102. First spacing 210 and second spacing 212 may be filled with the same dielectric material as dielectric region 204, or with a different dielectric material. The one or more conductive materials are patterned in a layer-by-layer process to form conductive structures 206 and/or the second group of conductive structures 208. Each conductive structure includes vias alternating with conductive blocks. For example, in the illustration of MIM capacitor 101, the grey blocks may represent patterned conductive blocks, while the white blocks represent vias. The vias may include, but are not limited to, one or more of W, Al, Ti, TiN, Ta, TaN, and Cu.

Still referring to FIG. 2B, dielectric region 204 is situated between first conductive plate 102 and second conductive plate 104, and surrounds first group of conductive structures 206 and second group of conductive structures 208. According to an embodiment, dielectric region 204 includes one or more high-k materials such as aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), or any other suitable material having a dielectric constant greater than a dielectric constant of silicon dioxide ($SiO_2$).

As illustrated in FIG. 2B, the one or more high-k materials are situated between the rows and columns of the matrix of rows and columns such that the one or more high-k materials encapsulate the first group of conductive structures 206 and the second group of conductive structures 208 between the first conductive plate 102 and the second conductive plate 104. Dielectric region 204 prevents each of the conductive structures from among the first group of conductive structures 206 from physically and/or electrically connecting each other and from physically and/or electrically connecting the second group of conductive structures 208. Similarly, dielectric region 204 prevents each of the conductive structures from among the second group of conductive structures 208 from physically and/or electrically connecting each other and from physically and/or electrically connecting the first group of conductive structures 206. In some situations, one or more low-k materials may be situated between some of the rows and columns of the matrix of rows and columns such that a combination of the one or more high-k materials and the one or more low-k materials are in dielectric region 204.

Exemplary Method of Making a Vertical MIM Capacitor

Figure 3A:
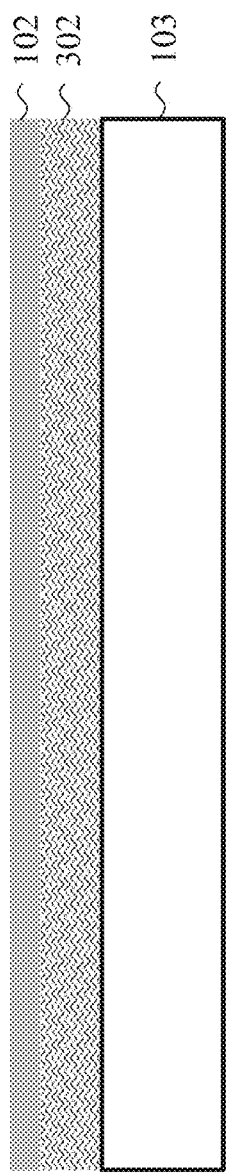
FIGS. 3A through 3O illustrate an exemplary method of fabrication of the exemplary vertical MIM capacitor of FIG. 2A, according to an embodiment.

FIGS. 3A through 3O illustrate an exemplary method of making a vertical MIM capacitor. The method includes a multiple-step sequence of photolithographic and chemical processing steps to create a vertical MIM capacitor, such as MIM capacitor 101, having a high-k dielectric material. The electrodes of such an exemplary MIM capacitor are formed by any suitable processes for forming multiple levels of metal interconnect, as would be understood by a person skilled in the art. The interconnect levels are isolated from each other by intervening dielectric layers, and selectively connected by electrically conductive vias disposed in an intervening dielectric layer.

FIG. 3A illustrates the beginning stage of fabricating a MIM capacitor, according to an embodiment. The MIM capacitor is formed over a substrate 103 having an insulating layer 302. Insulating layer 302 may be any insulating material used to isolate the conductive structures of the capacitor from substrate 103. Examples of insulating layer 302 include silicon dioxide and silicon nitride. First conductive plate 102 is patterned over insulating layer 302. In one example, first conductive plate 102 is shaped like a sheet of metal (as illustrated in FIG. 2A), but in other examples first conducive plate 102 includes connected strips of metal. First conductive plate 102 forms a part of the first electrode of the MIM capacitor.

Figure 3B:
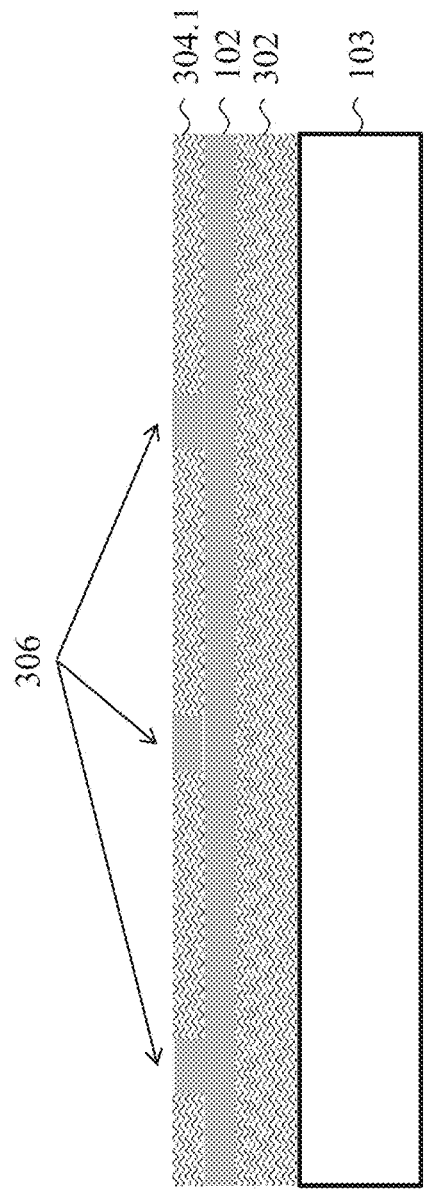

FIG. 3B illustrates the deposition of dielectric layer 304.1, and the formation of vias 306. Dielectric layer 304.1 may be any dielectric material commonly used in integrated circuits, such as silicon dioxide. Dielectric layer 304.1 is patterned using conventional photolithographic techniques to form via openings that are filled with metal to create vias 306. The surface is planarized to create a smooth top surface of dielectric layer 304.1 and metal vias 306. The polishing may be performed using chemical mechanical polishing (CMP) as would be understood to a person skilled in the art. Dielectric layer 304.1 forms the first of many dielectric layers throughout the fabrication of the MIM capacitor.

Figure 3C:
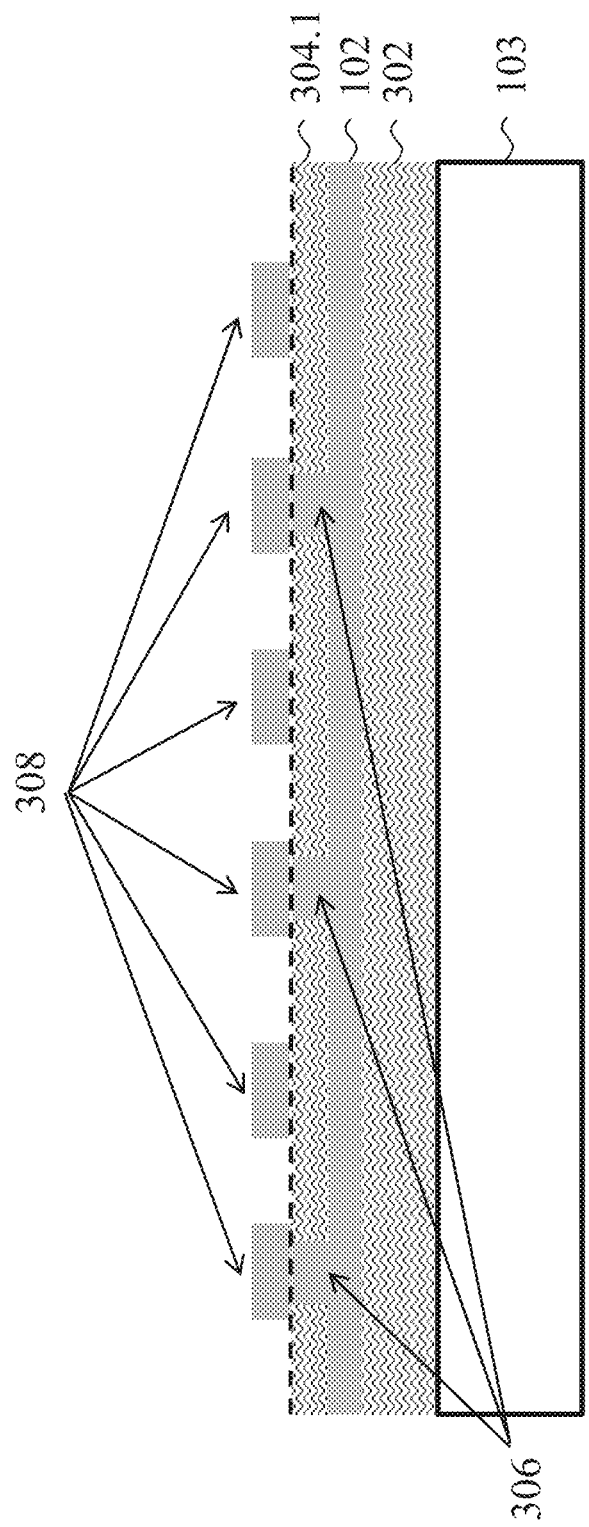

FIG. 3C is a cross-sectional view of the structure of FIG. 3B after the deposition and patterning of metal pads 308 on the surface of dielectric layer 304.1. Metal pads 308 may be any suitable metal, metal alloy, or metal stack, including but not limited to one or more of W, Al, and Cu. In one embodiment, a first group of metal pads 308 are patterned so as to be in alignment with vias 306, and thus physically and electrically connect with vias 306. A second group of metal pads 308 are formed over the surface of dielectric layer 304.1 and are electrically isolated from the first group of metal pads. The first group of metal pads 308 are part of the first electrode of the MIM capacitor while the second group of metal pads 308 are part of the second electrode of the MIM capacitor.

Figure 3D:
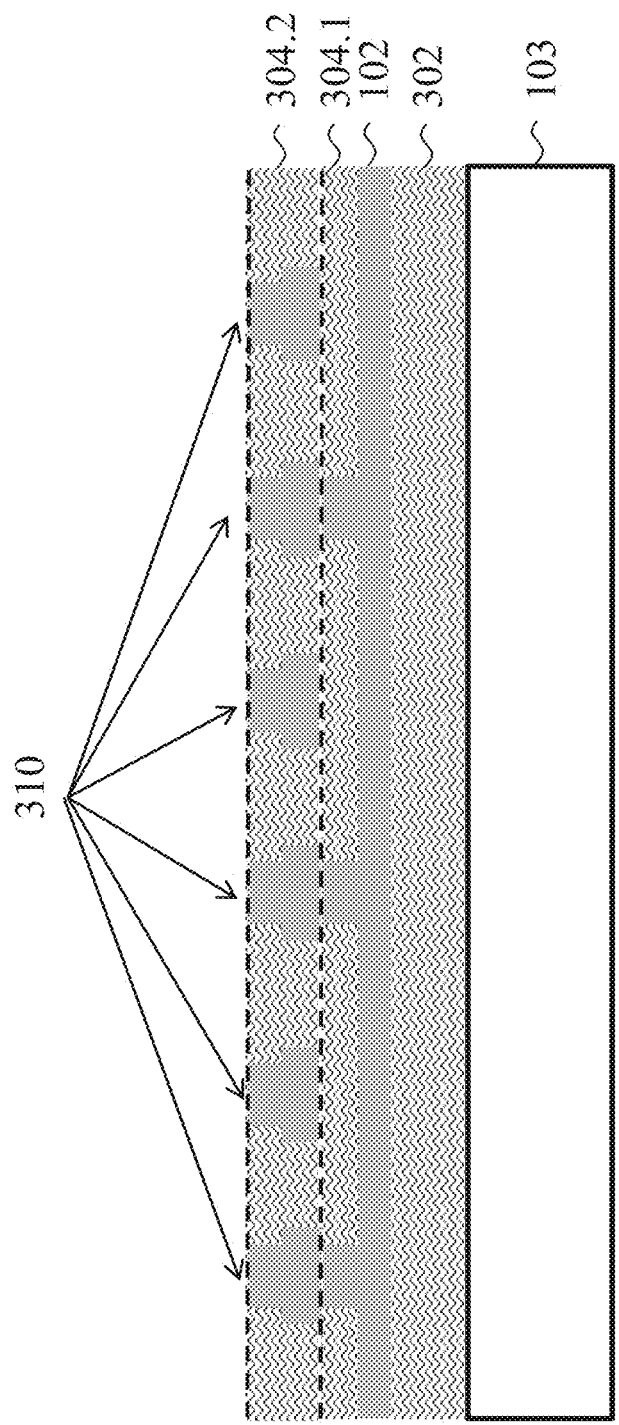

FIG. 3D illustrates the deposition and patterning of dielectric layer 304.2 and vias 310. Specifically, dielectric layer 304.2 is etched to form via openings over each metal pad 308, and the via openings are filled with metal to form vias 310. The surface is typically polished to create a planar top surface of dielectric layer 304.2 and vias 310. The polishing may be performed using CMP as would be understood by a person skilled in the art. The dotted horizontal lines are used to differentiate between the different dielectric layers. Dielectric layer 304.2 may include the same material as dielectric layer 304.1.

Those skilled in the art will recognize that patterned interconnect metal and vias may be formed by the damascene or dual damascene metallization methods, or alternatively by via fill and subtractive metal etch.

Figure 3E:
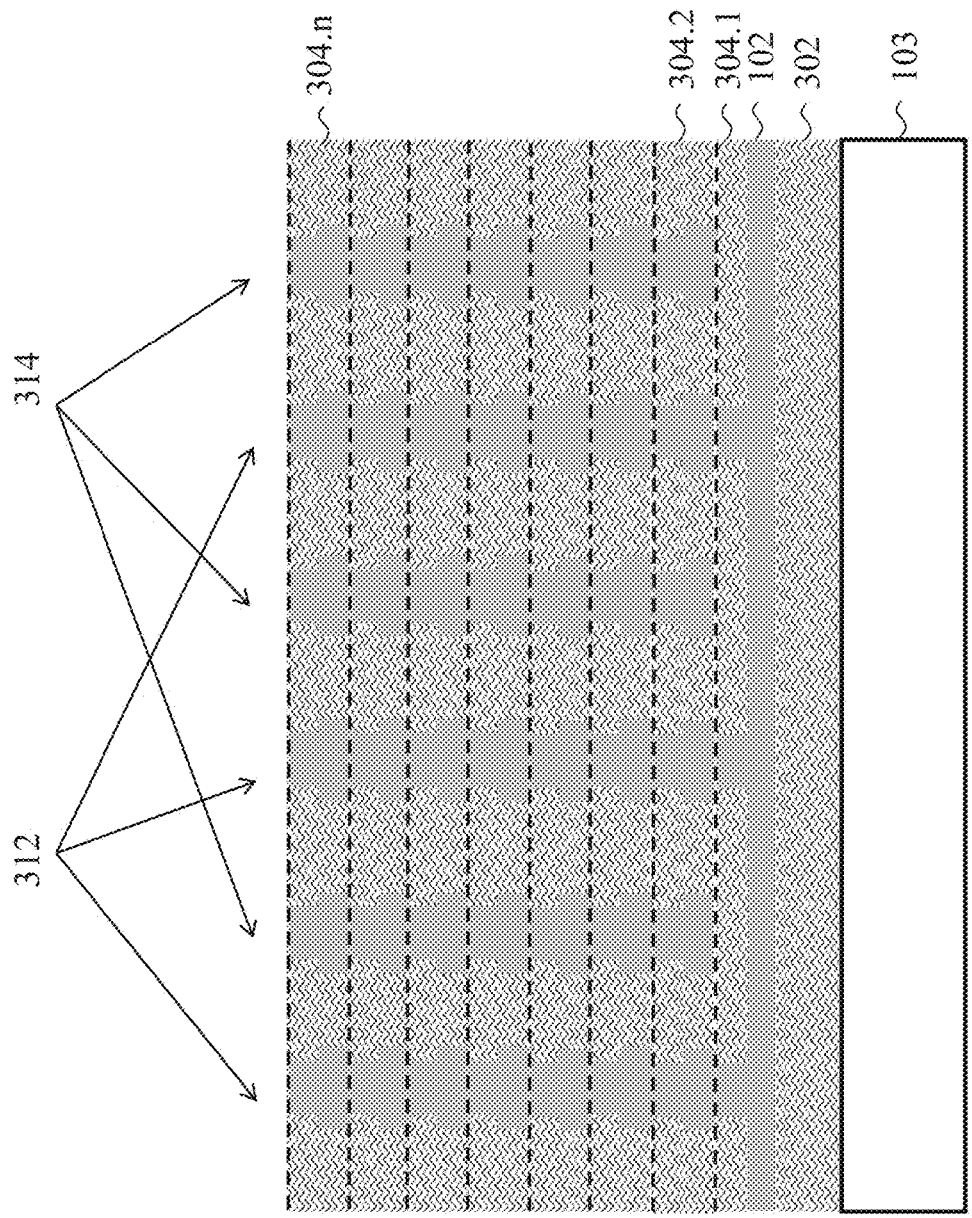

FIG. 3E illustrates the layer structure of the MIM capacitor after repeating the fabrication steps discussed above with reference to FIGS. 3C and 3D. Ultimately, n number of dielectric layers are deposited, with vertical conductive structures being formed through the n dielectric layers (the $n^{th}$ dielectric layer is identified as 304.n.) The fabrication steps result in a first group of vertical conductive structures 312 that are physically and electrically connected to first conductive plate 102, and a second group of vertical conductive structures 314 that are electrically isolated from first conductive plate 102. The first and second vertical conductive structures may be formed in an interdigitated arrangement as illustrated in FIGS. 2A and 2B.

It should be understood that other metal deposition techniques may be used to form the vertical conductive structures, as would be understood by a person skilled in the art. For example, deep through-holes may be etched through multiple dielectric layers, and metal is deposited within the through-holes to form the vertical conductive structures.

Figure 3F:
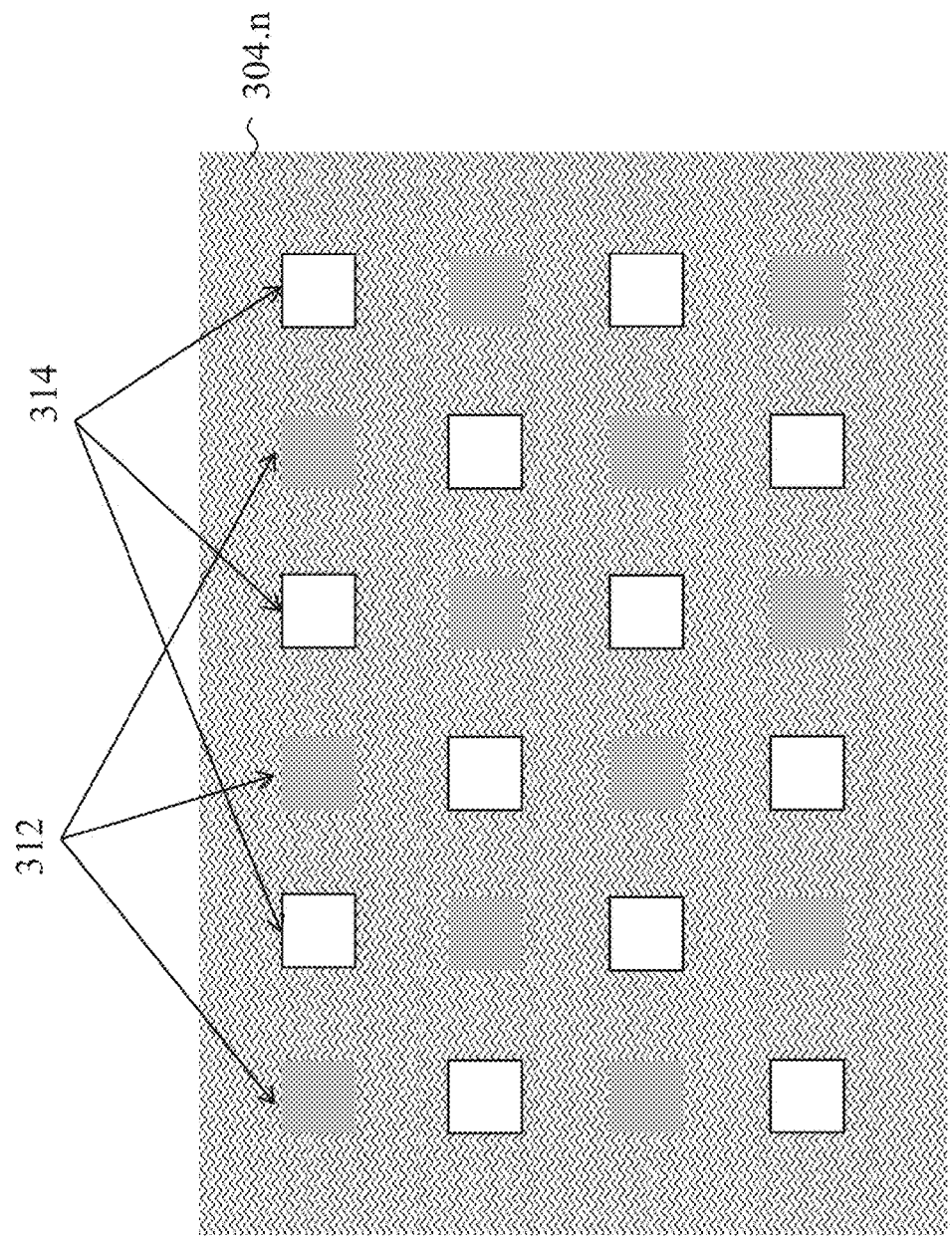

FIG. 3F illustrates a top-down view of the MIM capacitor once fabrication has reached the stage illustrated in FIG. 3E. First group of vertical conductive structures 312 (grey boxes) are shown interdigitated with second group of vertical conductive structures 314 (white boxes). It should be understood that other arrangements are possible as well without deviating from the scope or spirit of the exemplary embodiments described herein.

Figure 3G:
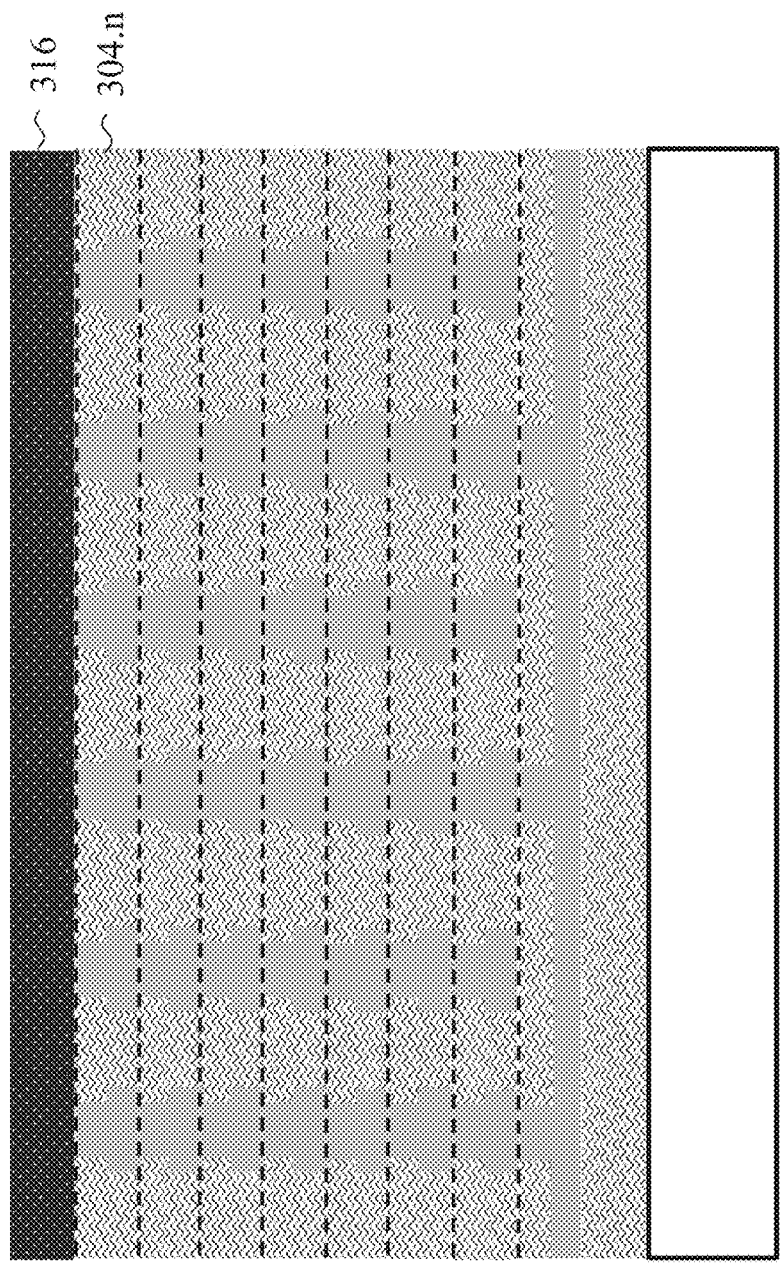

FIG. 3G illustrates the deposition of a holding layer 316 across the top surface of the MIM capacitor. Holding layer 316 may be any suitable rigid material with etch selectivity to at least the material used for dielectric layers 304.1-304.n. Holding layer 316 may have a thickness between about 10 nm and about 100 nm. Holding layer 316 may be, but is not limited to, a material such as titanium nitride or tantalum nitride.

Figure 3H:
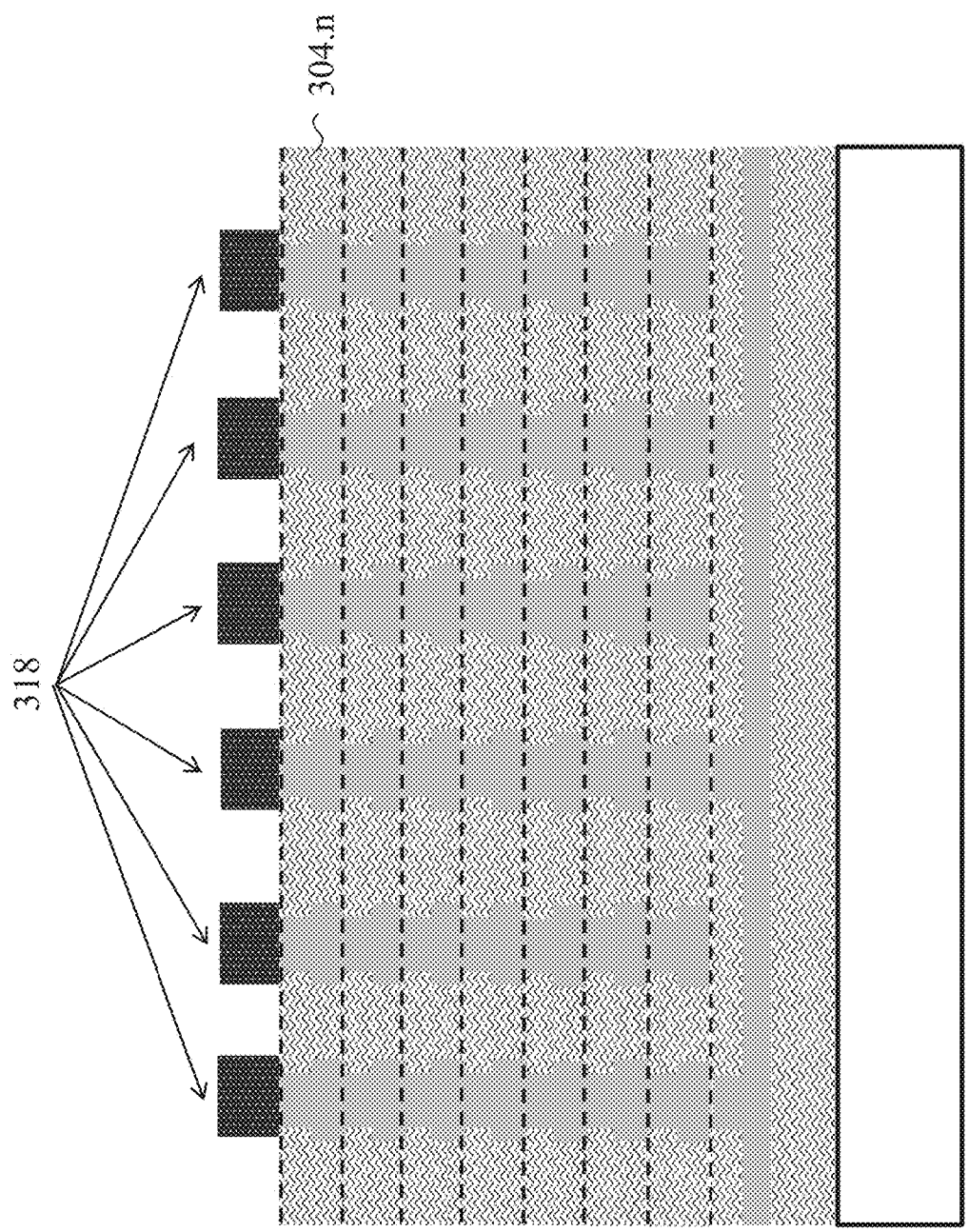

FIG. 3H illustrates the patterning of holding layer 316 to form support strips 318 using conventional lithographic techniques. Support strips 318 connect to each of the vertical conductive structures and support the vertical conductive structures when the dielectric material is removed in a later operation.

Figure 3I:
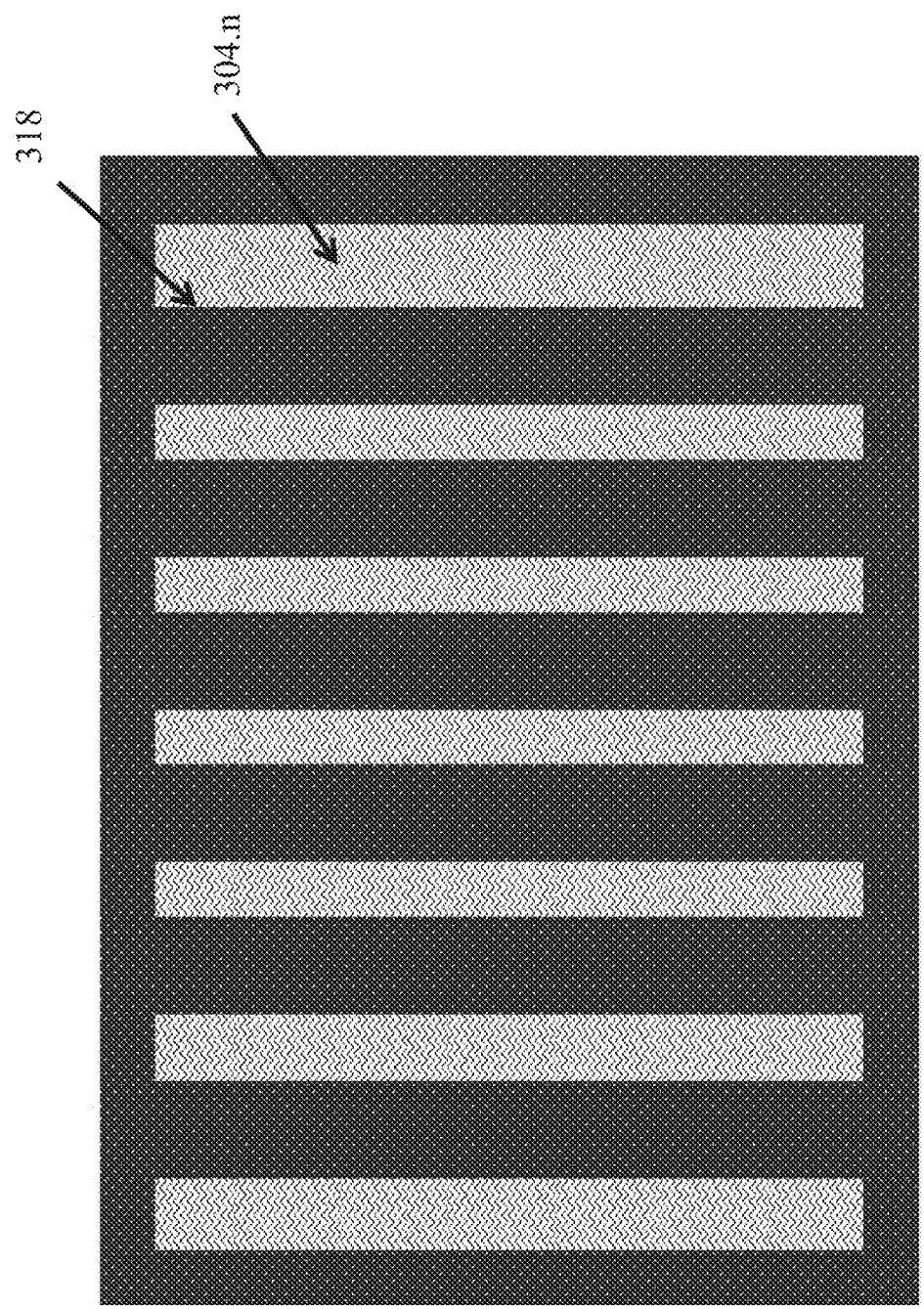

FIG. 3I is a top-down view of the MIM capacitor once fabrication has reached the stage illustrated in FIG. 3H. Support strips 318 can be seen connecting across the tops of multiple vertical conductive structures (patterned beneath the strips). Each support strip 318 also connects to a remainder of the film that made up holding layer 316. The top surface of the top dielectric layer 304.n is exposed between support strips 318. Holding layer 316 may be patterned in different ways to create support strips 318. For example, the support strips may be patterned horizontally, vertically, or in a crisscross pattern (all as viewed from a top-down point of view).

Figure 3J:
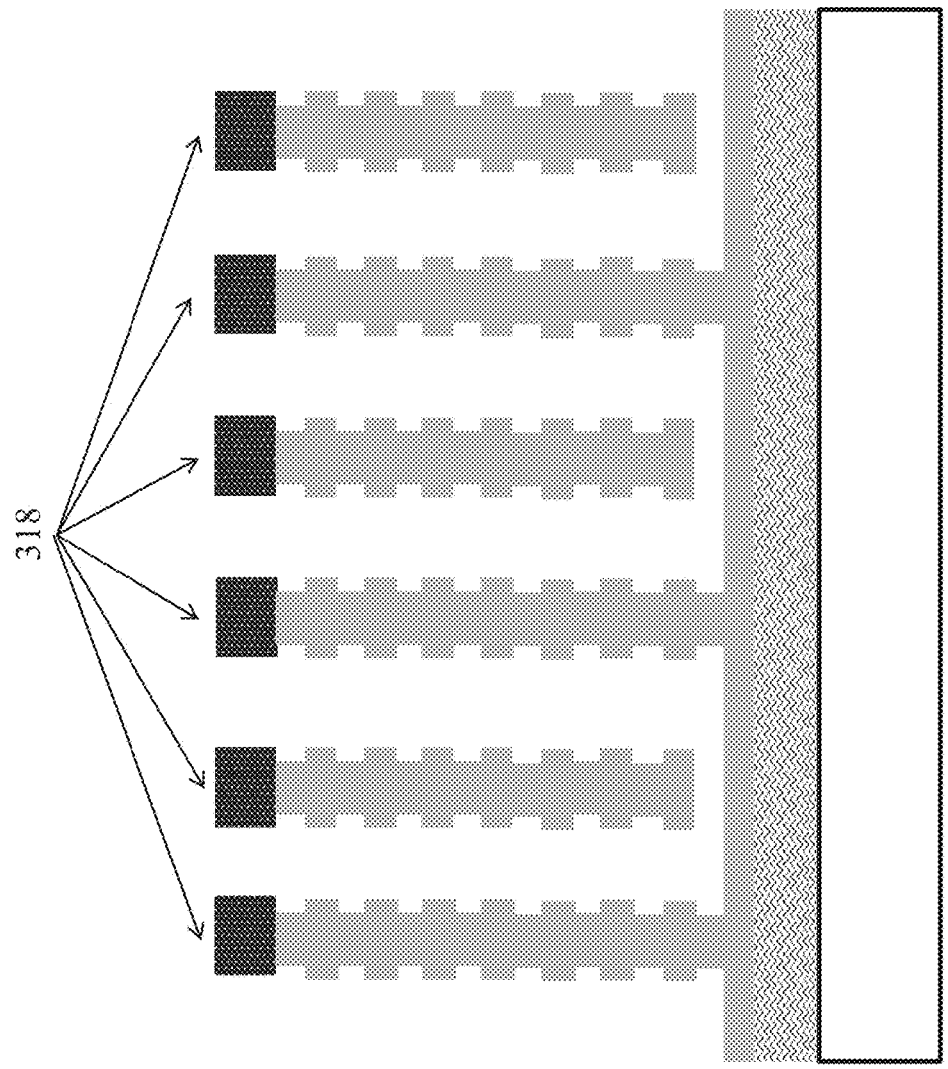

FIG. 3J illustrates the removal of each dielectric layer (304.1-304.n) of the MIM capacitor. Each dielectric layer may be etched away using various reactive gases or wet etchants. For example, hydrofluoric acid (HF) may be used to etch away silicon dioxide dielectric layers. In one particular example, a water based solution of about 40% $NH_4F$ and 50% HF is used at room temperature to etch away each dielectric layer of the MIM capacitor. Any wet etching process may be followed with a critical-point drying procedure in an effort to avoid damaging the vertical conductive structures upon removal of the wet etchant from around the vertical conductive structures. Example dry etching techniques include etching with fluorine-based reactive gases. Example fluorine-based gases include $CF_4$, $C_4F_8$, etc. The fluorine-based gas may be applied in a chamber having a chamber pressure between about 10 mTorr and 100 mTorr. Multiple etching steps may be performed to achieve a near-complete removal of the dielectric material from around all of the vertical conductive structures. For example, different gas concentrations or chemistries may be used in different etching steps, or a combination of dry etching and wet etching may be performed to remove as much of each dielectric layer (304.1-304.n) as possible. All of the vertical conductive structures remain mechanically fixed in position due to support strips 318.

Figure 3K:
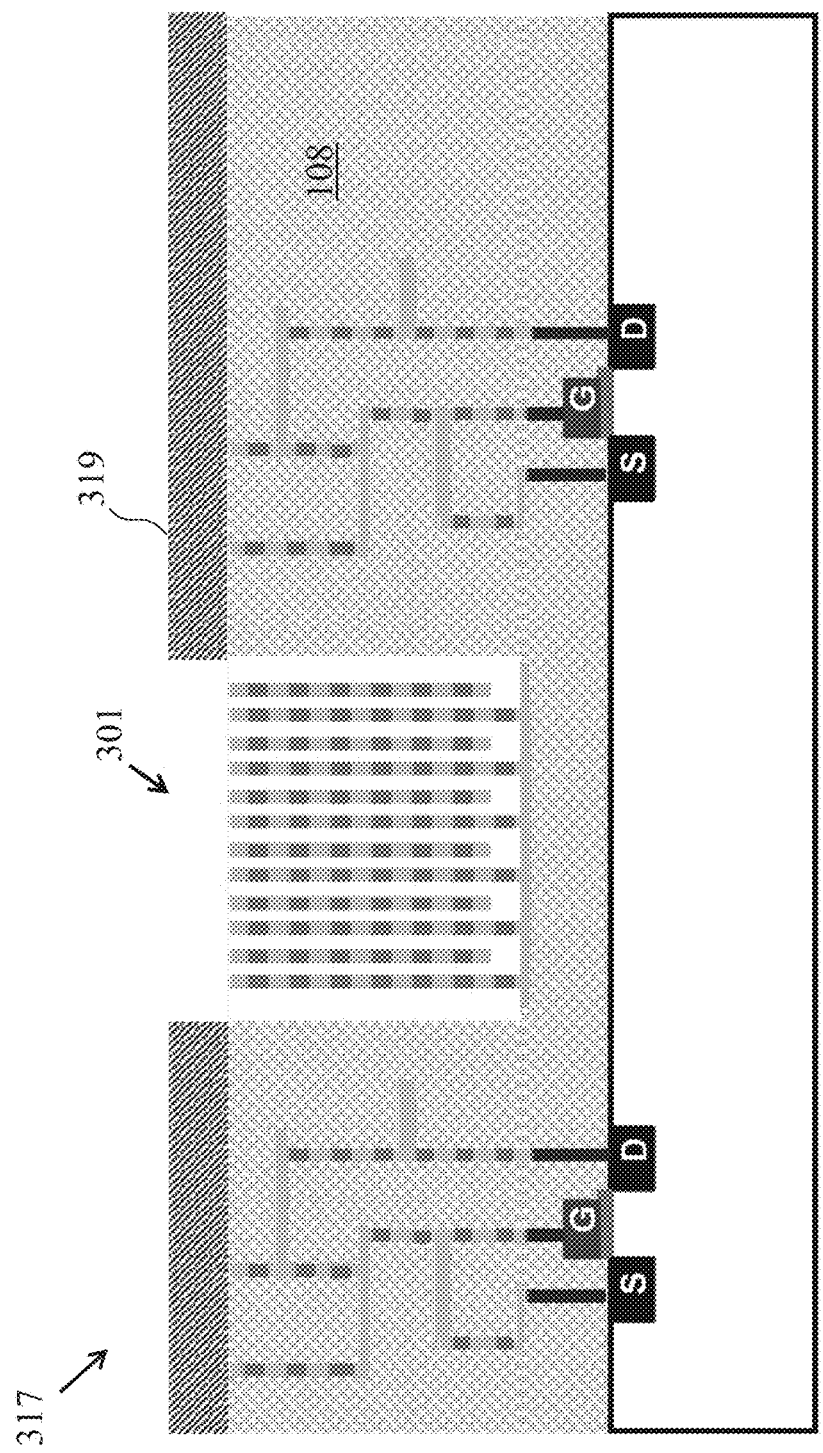

FIG. 3K illustrates an example integrated circuit 317, showing partially fabricated MIM capacitor 301 having dielectric material 108 removed from around the conductive structures of the capacitor, according to an embodiment. A masking layer 319 may be applied to protect the dielectric material 108 from being removed elsewhere in the integrated circuit. Masking layer 319 may be a photoresist, or a hardmask such as silicon nitride.

Figure 3L:
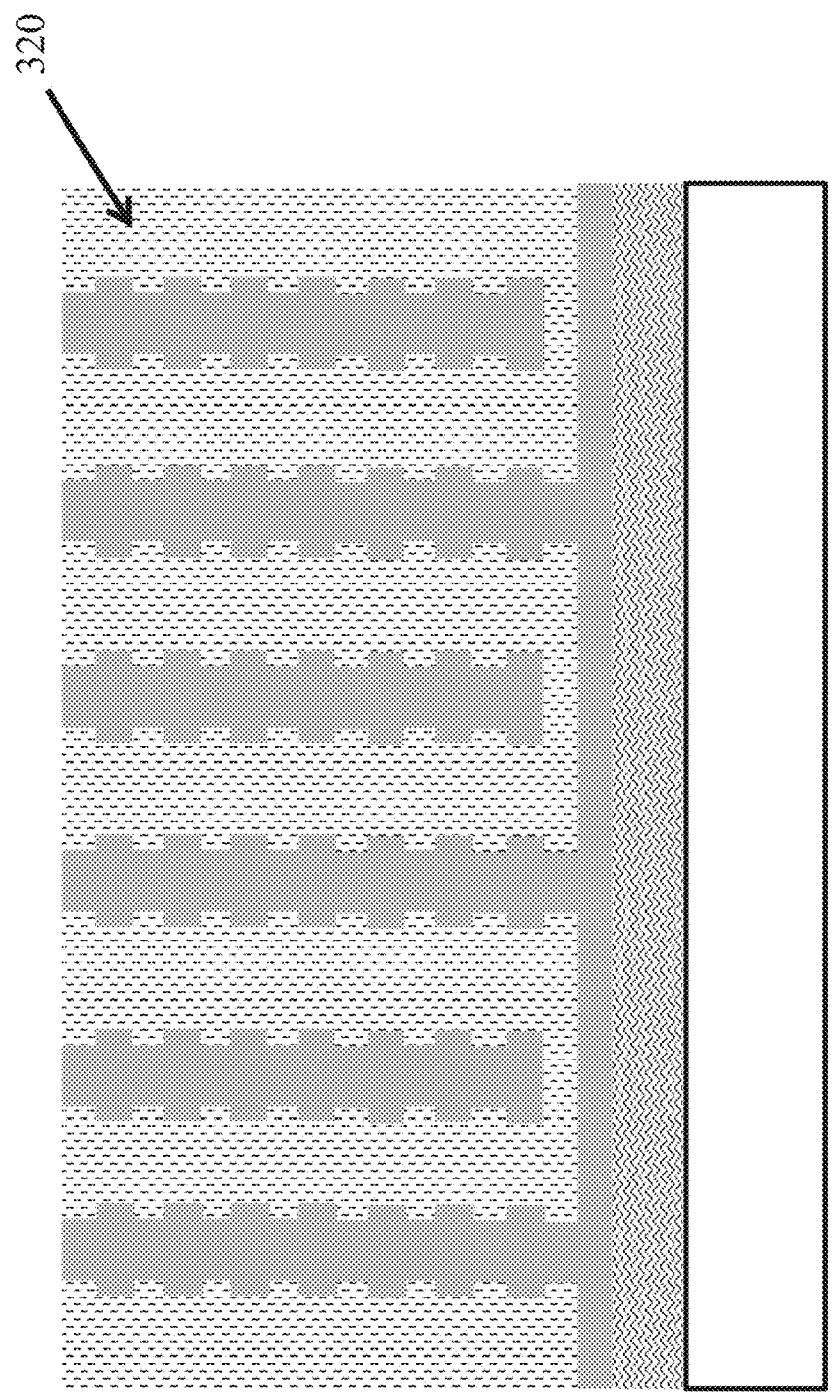

FIG. 3L illustrates the deposition of high-k dielectric 320 within the MIM capacitor around the various vertical conductive structures, followed by the removal of holding layer 316 (and its support strips 318). High-k dielectric 320 may be deposited using any known process, such as, but not limited to, chemical vapor deposition (CVD), atomic layer chemical vapor deposition (ALCVD), and spin-on techniques. In an embodiment, a thin film (e.g., 5 nm-50 nm) of high-k dielectric 320 is first deposited using ALCVD, followed by a deposition of high-k dielectric 320 using CVD to fill the remaining space between vertical conductive structures 312 and 314. The CVD process may be a flowable CVD process. Examples of high-k dielectric 320 include aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), or any other suitable material having a dielectric constant greater than a dielectric constant of silicon dioxide ($SiO_2$).

In an embodiment, a first high-k dielectric material may be deposited followed by deposition of a second high-k dielectric material. For example, any of $Ta_2O_5$, $TiO_2$, $HfO_2$, $ZrO_2$, $Al_2O_3$, $La_2O_3$, and $Pr_2O_3$ may first be deposited using ALCVD followed by deposition of any of $Ta_2O_5$, $TiO_2$, $HfO_2$, $ZrO_2$, $Al_2O_3$, $La_2O_3$, $Pr_2O_3$, $SrTiO_3$, $BaTiO_3$, $PbTiO_3$, $PbTiO_3$, $CaCu_3Ti_4O_{12}$, and $Pb[Zr_xTi_{1-x}]O_3$ using flowable CVD to fill the remaining area between vertical conductive structures 312 and 314.

Figure 3M:
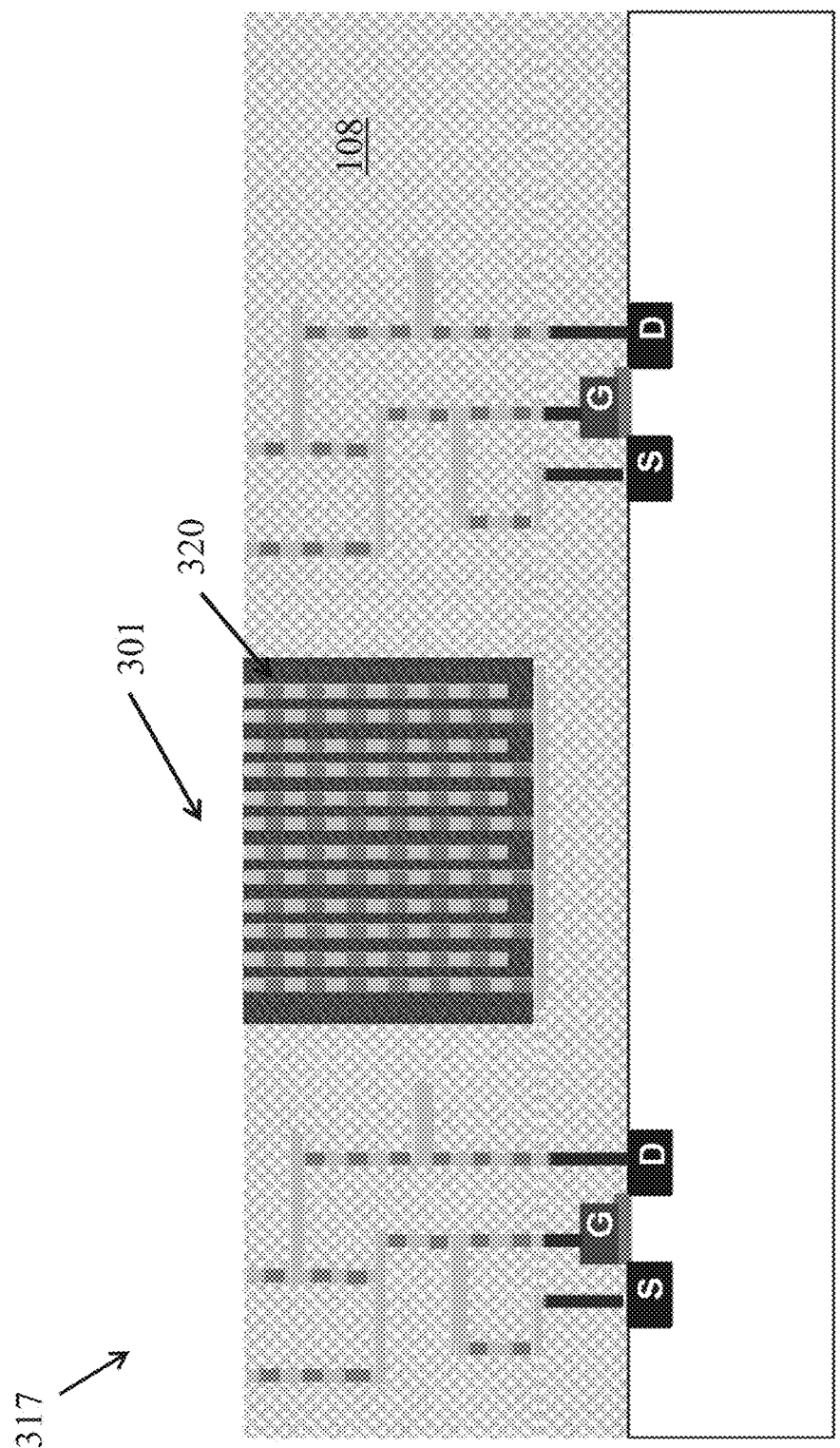

FIG. 3M illustrates integrated circuit 317 after deposition of high-k dielectric 320 and planarization. As can be seen in the figure, other devices of integrated circuit 317 are electrically insulated by dielectric material 108 (which may be a low-k dielectric), while partially fabricated MIM capacitor 301 includes high-k dielectric 320. In an embodiment, high-k dielectric 320 is disposed within a recess formed within dielectric material 108.

Figure 3N:
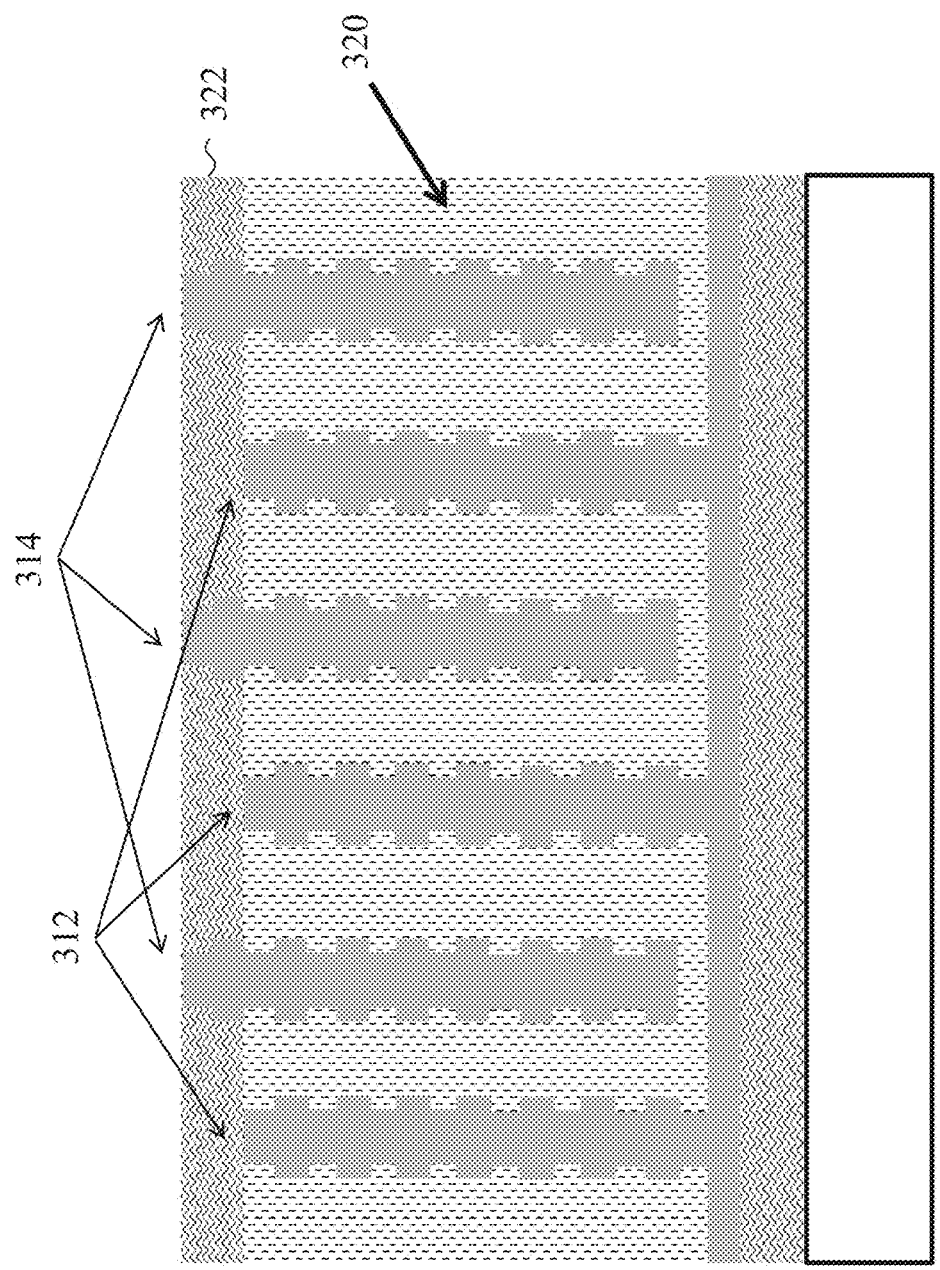
Figure 30:
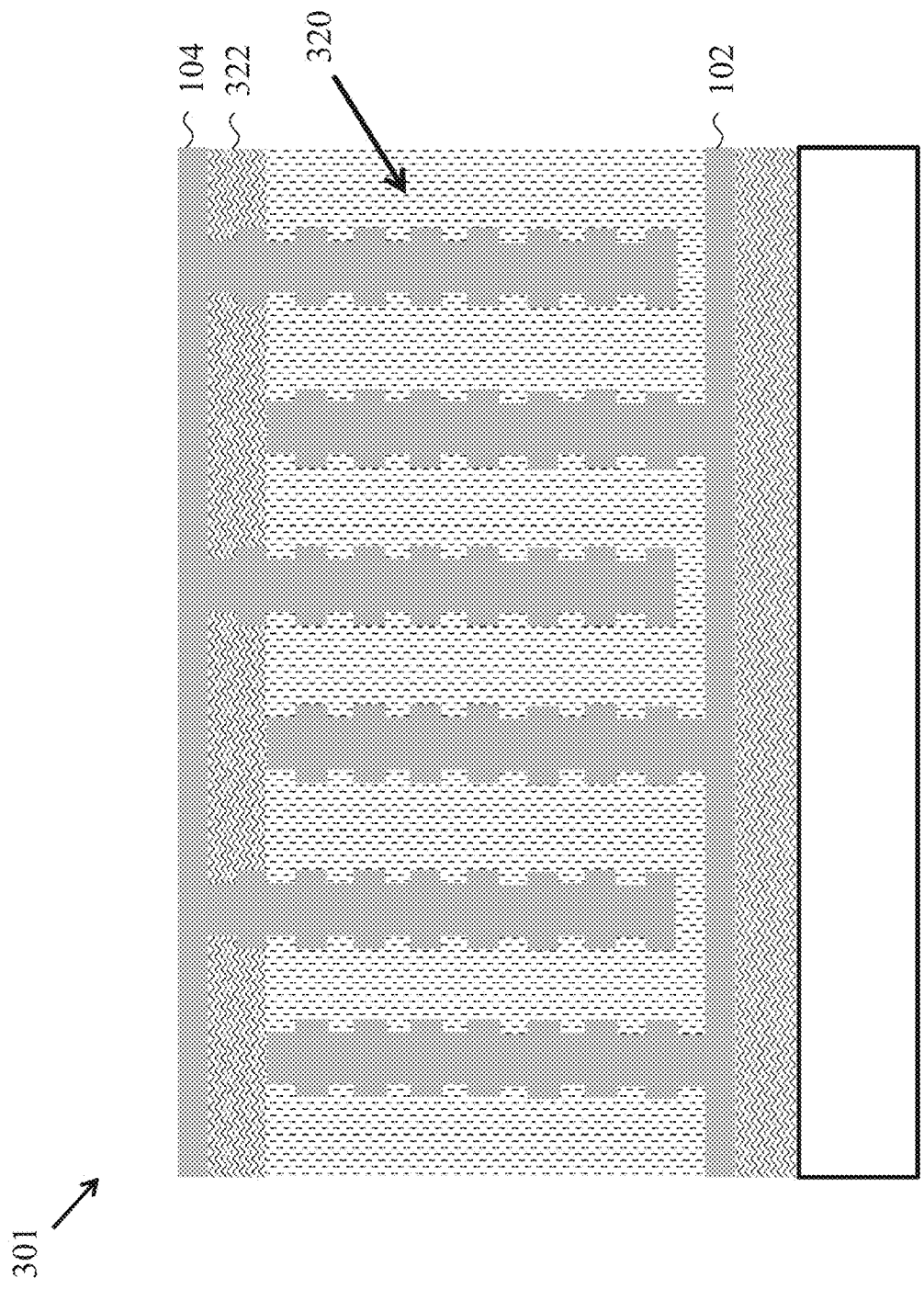

FIG. 3N illustrates the deposition of a dielectric layer 322, with metal pads and vias formed within in to align over second group of vertical conductive structures 314. Note that these additional metal pads and vias are patterned only over second group of vertical conductive structures 314, and not over first group of vertical conductive structures 312, according to an embodiment. Dielectric layer 322 may be the same material as high-k dielectric 320, or may be a different dielectric material.

FIG. 3O illustrates the patterning of second conductive plate 104 across the top surface of final dielectric layer 322. In one example, second conductive plate 104 is shaped like a sheet of metal (as illustrated in FIG. 2A), but in other examples second conducive plate 104 includes connected strips of metal. Second conductive plate 104 forms a part of the second electrode of MIM capacitor 301. At the conclusion of the fabrication, MIM capacitor 301 includes a first electrode having first conductive plate 102 with first physically and electrically connected vertical conductive structures, and a second electrode having a second conductive plate 104 with second physically and electrically connected vertical conductive structures that are interdigitated with the first physically and electrically connected vertical conductive structures, according to an embodiment. MIM capacitor 301 also includes a high-k dielectric 320 disposed between the first and second conductive plates (102 and 104.)

Figure 4:
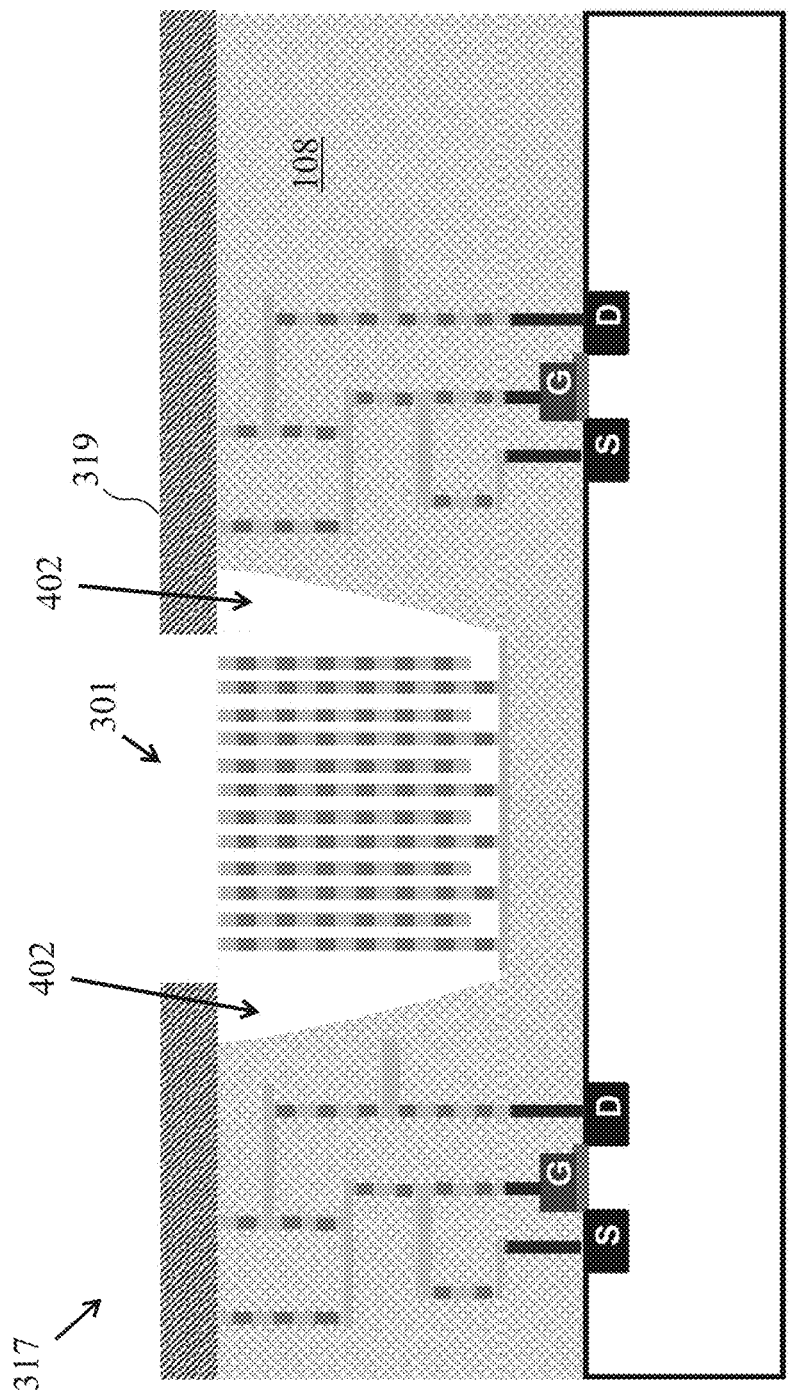
FIG. 4 illustrates a cross-sectional view of an integrated circuit during fabrication of a MIM capacitor, according to an embodiment.

FIG. 4 illustrates another example of partially fabricated MIM capacitor 301 having dielectric material 108 removed from around the conductive structures of the capacitor using an isostropic etch, according to an embodiment. A masking layer 319 may be applied to protect the dielectric material 108 from being removed elsewhere in the integrated circuit. The isotropic etch may use wet chemical etchants, such as hydrofluoric acid (HF) or a water based solution of about 40% $NH_4F$ and 50% HF. The isotropic etch causes some of dielectric material 108 to be removed from undercut regions 402 beneath masking layer 319.

The foregoing Detailed Description discloses a vertical (MIM) capacitor. In a first embodiment, the MIM capacitor includes a first conductive plate and a second conductive plate each horizontally-oriented and parallel to a substrate and separated from each other by a distance. The vertical MIM capacitor also includes a first group of conductive structures and a second group of conductive structures vertically-oriented with respect to the substrate, the first group of conductive structures and the second group of conductive structures being physically and electrically connected to the first conductive plate and the second conductive plate, respectively. A high-k dielectric material is disposed between the first electrode and the second electrode. The high-k dielectric material is disposed within a recess formed within a second dielectric material having a dielectric constant lower than the high-k dielectric material.

In a second embodiment, an integrated circuit includes a substrate, a plurality of field effect transistors (FETs) physically separated from a first metal interconnect level disposed above the plurality of FETs by at least a first dielectric layer, and a first electrode of a vertical metal-insulator-metal (MIM) capacitor that comprises a first conductive plate horizontally-oriented and parallel to the substrate, and a first group of conductive structures vertically-oriented with respect to the substrate, the first group of conductive structures being physically and electrically connected to the first conductive plate, and a second electrode of the vertical MIM capacitor that includes a second conductive plate horizontally-oriented and parallel to the substrate, and a second group of conductive structures vertically-oriented with respect to the substrate, the second group of conductive structures being physically and electrically connected to the second conductive plate, and a second dielectric material disposed between the first electrode and the second electrode, the second dielectric material having a higher dielectric constant than the first dielectric material.

The foregoing Detailed Description also discloses a method for making a vertical MIM capacitor. The method includes depositing a holding layer over a first group of conductive structures and a second group of conductive structures. The holding layer is horizontally-oriented and parallel to a substrate and the first group of conductive structures and the second group of conductive structures are vertically-oriented with respect to the substrate, and are surrounded by a first dielectric material. The first group of conductive structures are physically and electrically connected to a first conductive plate. The method also includes etching the holding layer, such that portions of a top surface of the first dielectric material are exposed and removing the first dielectric material, such that the first group of conductive structures and the second group of conductive structures remain mechanically fixed to the holding layer after removal of the first dielectric material. A second dielectric material is then deposited into the space previously occupied by the first dielectric material. The second dielectric material has a higher dielectric constant than the first dielectric material. The method also includes forming a second conductive plate. The second group of conductive structures are physically and electrically connected to the second conductive plate.

The foregoing Detailed Description outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit, the method comprising:
depositing a holding layer over a first group of conductive structures and a second group of conductive structures, such that the holding layer is horizontally-oriented and parallel to a substrate and the first group of conductive structures and the second group of conductive structures are each vertically-oriented with respect to the substrate, and are surrounded by a plurality of inter-level dielectric layers, and wherein the first group of conductive structures are physically and electrically connected to a first conductive plate;
exposing portions of the plurality of inter-level dielectric layers;

removing the exposed portions of the plurality of inter-level dielectric layers, wherein the first group of conductive structures and the second group of conductive structures remain mechanically fixed to the holding layer after the removing;

depositing a second dielectric material into a space previously occupied by the portions of the plurality of inter-level dielectric layers, the second dielectric material having a higher dielectric constant than each of the plurality of inter-level dielectric layers; and forming a second conductive plate, the second group of conductive structures being physically and electrically connected to the second conductive plate.

2. The method of claim 1, wherein the second dielectric material comprises:
a material having a dielectric constant greater than a dielectric constant of silicon dioxide (SiO2), and
wherein each of the plurality of inter-level dielectric layers comprises a material having a dielectric constant less than or equal to the dielectric constant of SiO2.

3. The method of claim 1, wherein the exposing comprises etching the holding layer to form parallel strips that connect across the first group of conductive structures and the second group of conductive structures.

4. The method of claim 1, wherein the first group of conductive structures and the second group of conductive structures are arranged in a matrix of rows and columns.

5. The method of claim 1, further comprising:
depositing a third dielectric material after depositing the second dielectric material.

6. The method of claim 5, wherein the third dielectric material has a dielectric constant substantially the same as the dielectric constant of each of the plurality of inter-level dielectric layers.

7. The method of claim 1, further comprising:
removing the holding layer after depositing the second dielectric material.

8. A method of making an integrated circuit, the method comprising:
forming a plurality of field effect transistors (FETs) on a substrate;
forming a plurality of inter-level dielectric layers on the substrate and over the plurality of FETs;
depositing a holding layer over a first group of conductive structures and a second group of conductive structures, such that the holding layer is horizontally-oriented and parallel to the substrate and the first group of conductive structures and the second group of conductive structures are each vertically-oriented with respect to the substrate, the first group of conductive structures and the second group of conductive structures being surrounded by the plurality of inter-level dielectric layers;
exposing portions of the plurality of inter-level dielectric layers;
removing the exposed portions of the plurality of inter-level dielectric layers, wherein the first group of conductive structures and the second group of conductive structures remain mechanically fixed to the holding layer after the removing;
depositing a second dielectric material into a space previously occupied by the portions of the plurality of inter-level dielectric layers, the second dielectric material having a higher dielectric constant than each of the plurality of inter-level dielectric layers.

9. The method of claim 8, wherein the second dielectric material comprises:
a material having a dielectric constant greater than a dielectric constant of silicon dioxide (SiO2), and
wherein each of the plurality of inter-level dielectric layers comprises a material having a dielectric constant less than or equal to the dielectric constant of SiO2.

10. The method of claim 8, wherein the exposing comprises etching the holding layer to form parallel strips that connect across the first group of conductive structures and the second group of conductive structures.

11. The method of claim 8, wherein the first group of conductive structures and the second group of conductive structures are arranged in a matrix of rows and columns.

12. The method of claim 8, further comprising:
depositing a third dielectric material after depositing the second dielectric material.

13. The method of claim 12, wherein the third dielectric material has a dielectric constant substantially the same as the dielectric constant of each of the plurality of inter-level dielectric layers.

14. The method of claim 8, further comprising:
removing the holding depositing the second dielectric material.

15. A method of making an integrated circuit, the method comprising:
depositing a holding layer over a first group of conductive structures and a second group of conductive structures, wherein the first group of conductive structures and the second group of conductive structures are surrounded by a plurality of inter-level dielectric layers, and wherein the first group of conductive structures are physically and electrically connected to a first conductive plate;
removing portions of the plurality of inter-level dielectric layers, wherein the first group of conductive structures and the second group of conductive structures remain mechanically fixed to the holding layer after the removing;
depositing a second dielectric material into a space previously occupied by the portions of the plurality of inter-level dielectric layers, the second dielectric material having a higher dielectric constant than each of the plurality of inter-level dielectric layers; and
forming a second conductive plate, the second group of conductive structures being physically and electrically connected to the second conductive plate.

16. The method of claim 15, wherein the second dielectric material comprises:
a material having a dielectric constant greater than a dielectric constant of silicon dioxide (SiO2), and
wherein each of the plurality of inter-level dielectric layers comprises a material having a dielectric constant less than or equal to the dielectric constant of SiO2.

17. The method of claim 15, wherein the exposing comprises etching the holding layer to form parallel strips that connect across the first group of conductive structures and the second group of conductive structures.

18. The method of claim 15, wherein the first group of conductive structures and the second group of conductive structures are arranged in a matrix of rows and columns.

19. The method of claim 15, further comprising:
depositing a third dielectric material after depositing the second dielectric material.

20. The method of claim 19, wherein the third dielectric material has a dielectric constant substantially the same as the dielectric constant of each of the plurality of inter-level dielectric layers.

* * * * *

UNITED STATES PATENT AND TRADEMARK OFFICE
CERTIFICATE OF CORRECTION

PATENT NO. : 9,911,732 B2
APPLICATION NO. : 15/701218
DATED : March 6, 2018
INVENTOR(S) : Jou et al.

Page 1 of 2

It is certified that error appears in the above-identified patent and that said Letters Patent is hereby corrected as shown below:

On the Title Page

Item (57), under "ABSTRACT", Line 11, replace "MD" with -- ILD --, therefor.

In the Specification

In Column 2, Line 58, replace "capacitor" with -- MIM capacitor --, therefor.

In Column 3, Line 5, replace "Transistors" with -- Substrate --, therefor.

In Column 3, Line 48, replace "capacitor 100." with -- capacitor 101. --, therefor.

In Column 3, Line 66, replace "2A," with -- FIG. 2A, --, therefor.

In Column 4, Line 16, replace "Cu)," with -- Cu. --, therefor.

In Column 4, Line 45, replace "water" with -- wafer --, therefor.

In Column 4, Line 58, replace "tight" with -- right --, therefor.

In Column 5, Line 59, replace "(SiN)," with -- $(Si_3N_4)$, --, therefor.

In Column 8, Line 54, replace "(SiN)," with -- $(Si_3N_4)$, --, therefor.

In Column 8, Lines 64-65, replace "$PbTiO_3$, $PbTiO_3$," with -- $PbTiO_3$, --, therefor.

In Column 9, Line 38, replace "isostropic" with -- isotropic --, therefor.

Signed and Sealed this
Twenty-eighth Day of May, 2019

Andrei Iancu
*Director of the United States Patent and Trademark Office*

CERTIFICATE OF CORRECTION (continued)
U.S. Pat. No. 9,911,732 B2

In the Claims

In Column 11, Line 60, Claim 8, replace "removing;" with -- removing; and --, therefor.

In Column 12, Line 20, Claim 14, replace "holding" with -- holding layer after --, therefor.